United States Patent [19]
Hashimoto et al.

[11] 3,978,650
[45] Sept. 7, 1976

[54] ELECTRIC TIMEPIECE

[75] Inventors: Yukio Hashimoto, Niiza; Shigeru Morokawa, Higashiyamato, both of Japan

[73] Assignee: Citizen Watch Co., Ltd., Tokyo, Japan

[22] Filed: Oct. 23, 1974

[21] Appl. No.: 517,231

[30] Foreign Application Priority Data
Oct. 24, 1973 Japan .............................. 48-119605

[52] U.S. Cl. .............................. 58/23 AC; 331/176
[51] Int. Cl.² ........................ G04C 3/00; H03F 1/00
[58] Field of Search ............ 58/23 R, 23 AC, 50 R; 331/176

[56] References Cited
UNITED STATES PATENTS

| | | | |
|---|---|---|---|
| 1,850,580 | 3/1932 | Coram | 331/176 X |
| 3,714,867 | 2/1973 | Dargent | 58/50 R |
| 3,775,964 | 12/1973 | Fukumoto | 58/50 R |
| 3,800,523 | 4/1974 | Yamazaki | 58/23 R |

*Primary Examiner*—Edith Simmons Jackmon
*Attorney, Agent, or Firm*—Sherman & Shalloway

[57] ABSTRACT

An electronic timepiece which includes a time reference signal generator, which generates a signal which is used to count time, and is compensated in its frequency in order to have the predetermined frequency value regardless of variations in ambient temperature.

7 Claims, 20 Drawing Figures fig.3 fig.10

ELECTRIC TIMEPIECE

BACKGROUND OF THE INVENTION

This invention relates to an electronic timepiece including a system for compensating for the variation in a frequency of a time reference signal with a temperature by using a temperature signal generator. The electronic timepiece includes a time reference signal generator and means for forming a time count unit signal from the time reference signal. A time counting mechanism is provided for keeping a time by using the time count unit signal and a time display mechanism is provided for displaying the time kept in the time counting mechanism.

The frequency of a time reference signal should essentially be kept in the restricted range even when the temperature of the surroundings of the timepiece is varied.

The specific resonance frequency must be changed with the external temperature even in a crystal oscillator which is used as a reference oscillator for a time reference signal generator used in high accuracy timepieces.

In order to overcome the problems of variations in the resonance frequency, the prior art includes several approaches. For example, with measurement equipment, a time reference signal generator is placed in a constant temperature vessel. With another approach, the frequency of an output is maintained by counterbalancing the thermal characteristics of the crystal oscillator to the temperature-capacity characteristic of a temperature sensing element thereby changing continuously the capacity of the time reference signal generator.

The first prior art approach has problems in that large amounts of electric power are consumed and a large space is required. Furthermore, with the second approach, it is difficult to find a temperature compensating element which has a temperature-capacity characteristic corresponding to that of the reference oscillator which is somewhat complex. In addition many types of temperature compensating elements do not have sufficient durability and stability and there are difficulties in forming an integrated circuit of the temperature compensating system.

SUMMARY OF THE INVENTION

A primary object of this invention is to provide an electronic timepiece with a highly accurate, reliable and compact temperature compensating system which is capable of maintaining the accuracy of the frequency of the output of the time reference signal generator even in various temperature conditions. The system is also capable of obtaining a temperature compensated output signal which is accurate from the time count unit signal generator and of performing stepping control of the time counting mechanism which is equivalent to the control of the time counting mechanism.

Figure 1:
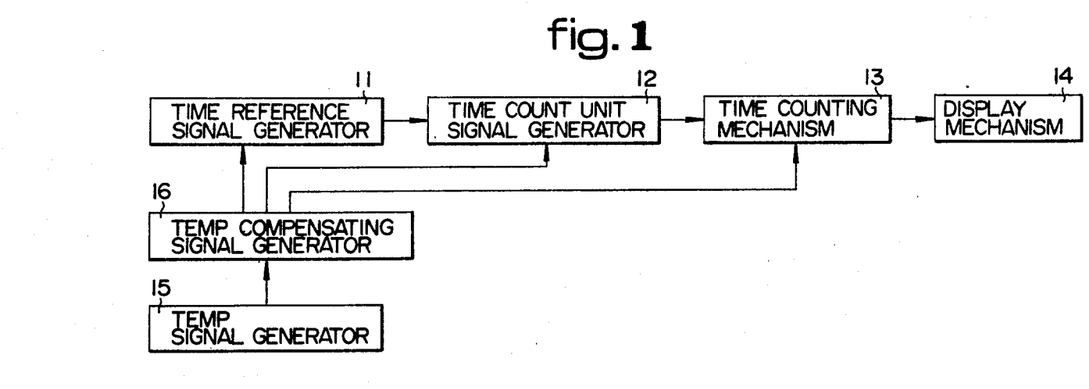
FIG. 1 is a block diagram showing the system which compensates by transducing the output of the temperature signal generator by temperature compensating signal generator.
Figure 2:
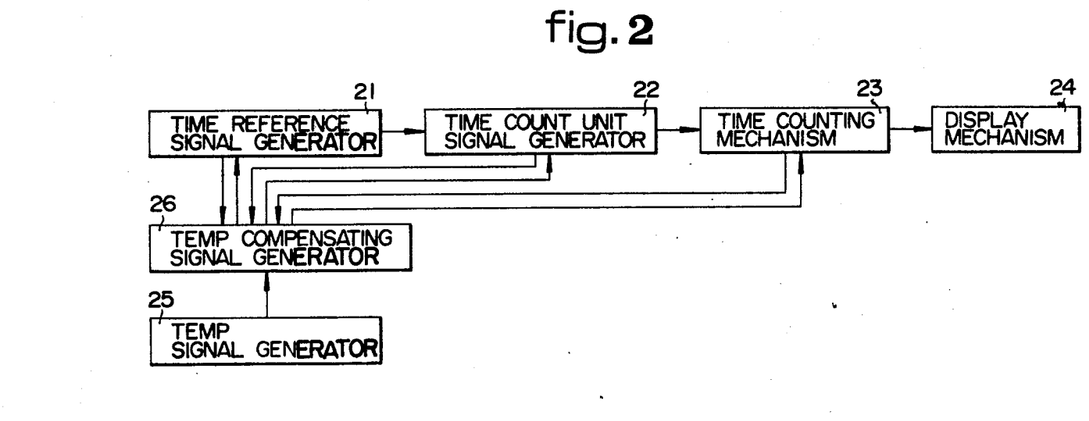
FIG. 2 is a block diagram showing the system which produces a signal by composing the outputs of the temperature signal generator, time reference signal generator and time count unit signal generator at the temperature compensating signal generator.

DETAILED DESCRIPTION OF THE INVENTION:

Referring to FIGS. 1 and 2, the following reference numerals designate the following circuit elements: 11 designates a time reference signal generator; 12, a time count unit signal generator; 13, a time counting mechanism for keeping a time by using a time count unit signal; 14, a mechanism for displaying the kept time; 15, a temperature signal generator; and 16, a temperature compensating signal generator, respectively.

The temperature signal generator 15 comprises an oscillator having a temperature sensing ability and the predetermined temperature-frequency characteristics. The frequency changing rate of the temperature-frequency characteristics thereof are generally larger than that of the time reference signal generator 11.

The output of the temperature signal generator 15 has a large rate of variation in its temperature-frequency characteristics so that the ambient temperature can easily be detected by measuring the frequency and, accordingly it can be considered that the output of the temperature signal generator 15 is to be the temperature signal. In FIG. 1 the signal transfer system is omitted, but it is necessary to obtain the frequency or time signal used as the standard in order to measure the frequency or periodic time. The signal from the time counting mechanism 13 or the temperature compensated time reference signal in the mechanism 13 is useful as the basis of the frequency measurement.

For example, if the rate of frequency variation with temperature of the crystal oscillator is approximately $10^{-5}$ and that of the output of the temperature signal generator 15 is approximately $10^{-3}$, then the frequency of the output of the temperature signal generator 15 can be measured with the smaller error by using the resonance frequency as the basis. Alternatively, a signal from the separate crystal oscillator or signal transmitted with an electric wave can be used as the basis.

In FIG. 1, the output of the temperature signal generator 15 is supplied to the temperature compensating signal generator 16 as a frequency signal having the predetermined temperature characteristics.

The temperature compensating signal generator 16 acts to convert the signal from the temperature signal generator 15 into a signal in the form of compensating the temperature characteristics of the output frequency of the time reference signal generator 11 in accordance with the frequency of the temperature signal and to send it to at least one of the time reference signal generator 11, time count unit signal generator 12 and time counting mechanism 13.

In the embodiment of FIG. 2, a temperature compensating signal is obtained as either a frequency corresponding to the difference between the frequency of the output from at least one of the following circuits: a time reference signal generator 21, a time counting unit signal generator 22 or time counting mechanism 23 and the frequency the output from a temperature signal generator 25 by mixing the signals in a temperature compensating signal generator 26, or a number given by using the last figure of the number and the figures near the last figure which are obtained by counting the number of pulses of the output from the temperature signal generator within the unit time determined by the time reference signal.

The above method in which the difference of the frequency values is used and the method in which the end of the numbers is taken by the overflow of a counter improve analysing ability in temperature detection.

The signal prepared by one of the methods set forth above is converted into a signal which can compensate the temperature characteristics of the output frequency of the time reference signal generator 21 and is sent to at least one the following circuits: the time reference signal generator 21, time count unit signal generator 22 or the time counting mechanism 23 as in the case of FIG. 1. The reference numeral 24 denotes a time display mechanism.

Figure 3:
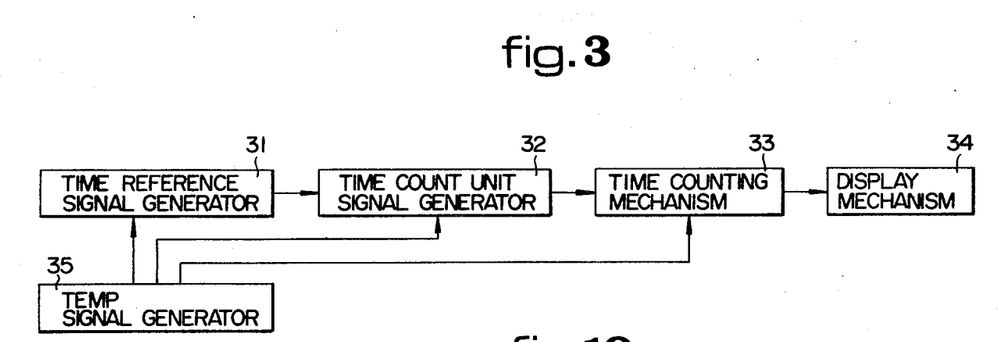
FIG. 3 shows a block diagram of the system in which the output of the temperature signal generator is used directly as a compensating signal.

FIG. 3 shows a block diagram of a system according to this invention similar to those shown in FIGS. 1 and 2 with the exception that the temperature compensating signal generator is omitted. In the system the temperature characteristics of the output frequency of a time reference signal generator 31 is compensated by sending the output frequency of a temperature signal generator 35 to at least one of the following circuits: a time reference signal generator 31, a time count unit signal generator 32 and a time counting mechanism 33. The reference numeral 34 indicates a time display mechanism.

Figure 4A:
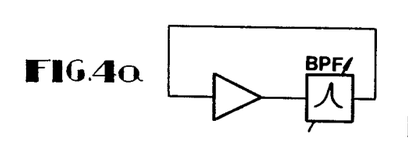
FIGS. 4(A), 4(B) and 4(C) show examples of the oscillators as the temperature signal generators, respectively.
Figures 4B, 4C:
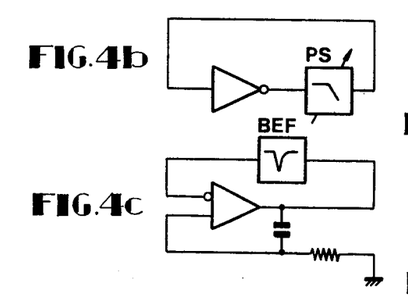
Figure 4D:
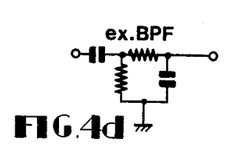
FIGS. 4(D), 4(E) and 4(F) show filter circuits used in the oscillators shown in FIGS. 4(A), 4(B) and 4(C), respectively.

FIG. 4(A) illustrates a temperature signal generating system using the combination of an amplifier having a positive amplifying rate and a band-pass filter and FIG. 4(D) discloses a filter including a band-pass filter, resistors and condencers.

Figure 4E:
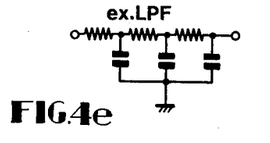

The filter may be one of those having a coil or a mechanical resonance element such as a ceramic filter and an electricmechanical transducer. FIG. 4(B) shows an oscillator having an oscillating frequency of about two times the shift time and includes an amplifier having a negative amplifying rate and a shifting element. FIG. 4(E) illustrates a circuit of a low-pass filter.

Figure 4F:
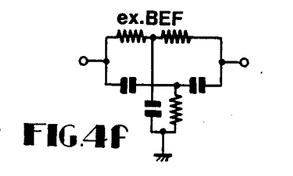

FIG. 4(C) shows an oscillator having a positive feed back amplifier acting as a tuning amplifier which can eliminate the components having the specified frequency and is given a negative feed back at the other frequency than the above by means of a filter, such as the filter of the circuit shown in FIG. 4(F).

Of course, with of the oscillators shown in FIGS. 4(A), 4(B) and 4(C) the oscillating condition should be satisfied.

If an oscillator having a larger variation rate in temperature-frequency characteristics is intended to be obtained, one or more elements which determine the resonance frequency of the oscillator shown in FIGS. 4(A), 4(B) or 4(C), such as a resistor, condenser or reactance, may be replaced with an element which varies its characteristics with temperature. For example, when one of the resistors is replaced with a thermistor or posistor, an oscillator acting as a temperature signal generator will be constructed. Furthermore, if one of the resistors is replaced with a variable resistor the temperature characteristics may be adjusted. This is also true for the replacement of capacitance.

Figure 4G:
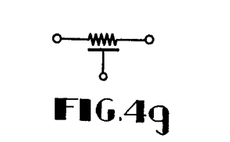
FIGS. 4(G) and 4(H) show examples of the composite elements.
Figure 4H:
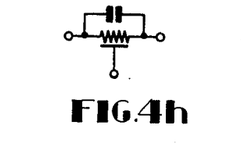

In the systems shown in FIGS. 4(D), 4(E) and 4(F) composite elements such as a distribution delay element shown in FIG. 4(G) or distribution cut filter shown in FIG. 4(H) may be used singly or in combination with an element having a temperature detecting ability. Alternatively, it is possible to use digital delay mechanism or filter mechanism including a logical circuit.

Figure 5A:
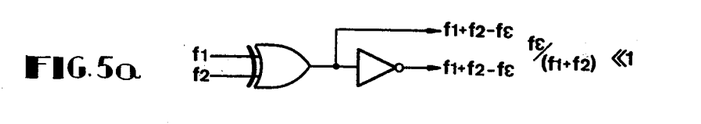
FIGS. 5(A) and 5(B) show circuits for performing frequency addition.
Figure 5B:
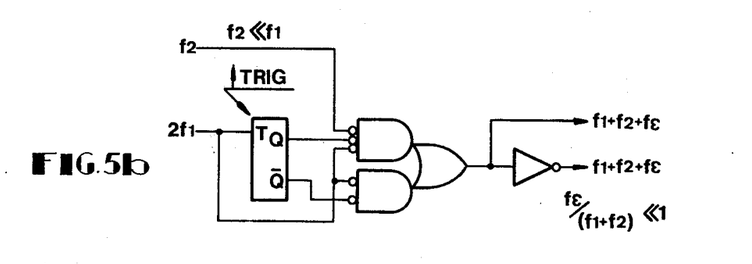
Figure 6:
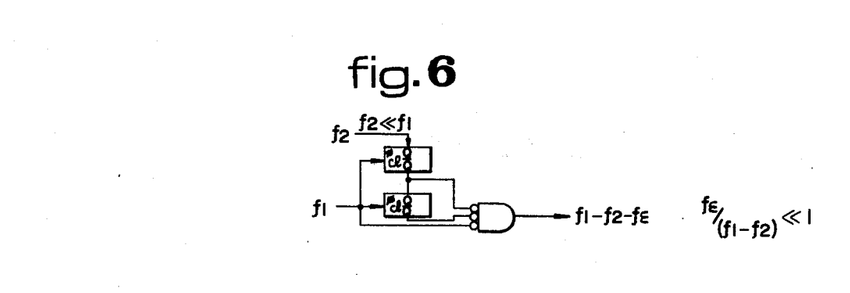
FIG. 6 is a diagram of a frequency subtracting circuit.

Circuits performing addition and subtraction of frequency are shown in FIGS. 5 and 6, respectively.

FIG. 5(A) shows an exclusive-OR gate or a logical not circuit which can add precisely two signals having frequencies of $(f_1)$ and $(f_2)$, respectively, unless the edges of the signals overlap with each other.

Error encountered upon addition would in probability be very small in the ratio to the signals to be added and is therefore negligible.

The circuit shown in FIG. 5b acts to add two signals having frequency values $2f_1$ and $f_2$ after reforming the wave form and arrangement in connection with the phase by a logic circuit. The circuit can improve the accuracy of addition in comparison with that shown in FIG. 5(A) due to the settlement of the phase of the added signals by the logic circuit.

FIG. 6 shows a circuit for obtaining a difference signal $f_2-f_1$ from two signals having frequency values of $f_1$ and $f_2$, respectively. The difference signal $f_2-f_1$ can also be obtained by counting the frequency values $f_1$ and $f_2$ in a counter separately and then taking the difference between two counted values at the desired time. In this case the information on the frequency difference will be obtained at a constant timing so that it is needed to make the information contiuous through a memory device if the difference is required continuously.

Alternatively, the output signal may be obtained at each time the difference in a counter reaches to the predetermined value.

In a simpler manner, the difference value or integrated value thereof can be obtained by using an up-down counter which is so operated that one signal is used to up count and the other signal to down count, with the counted value being read out by changing over or resetting the counter. A similar value can also be obtained by using an up-counter and by reading out or resetting the counter at constant intervals. For example, the frequency difference in the order of $1 \times 10^3$ between two signals having frequency values of $f_1$ and $f_2$ may be obtained by reading out the counted value of the frequency $f_1$ every time when the counted value reaches 1,000 or 10,000. Counters having a small capacity can be used due to the fact that the difference value appears as the end of the counted number, which enables overflowing of the higher figures.

Figure 7:
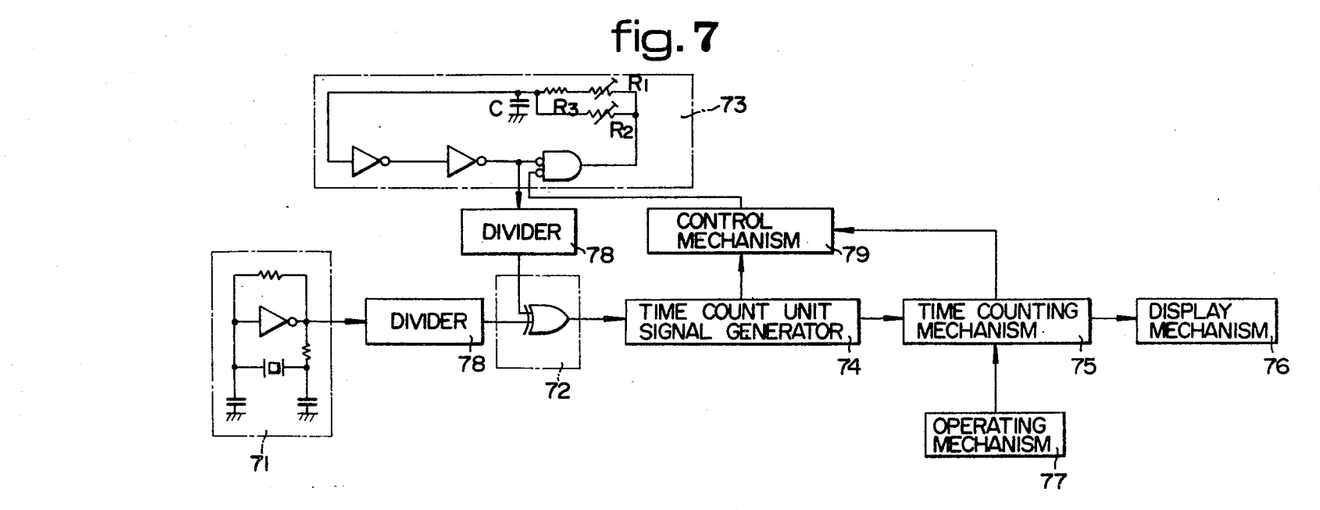
FIG. 7 shows a functional block diagram of the electronic timepiece having the temperature compensating mechanism comprising the temperature sensing oscillator and frequency adding means coupled therewith.

FIG. 7 shows an electronic timepiece having a temperature compensating mechanism for a time reference signal generator composed of a temperature signal generator and a frequency counter and a divider connecting thereto, which comprises a crystal oscillator 71 as a time reference signal generator, a frequency counter 72, an oscillator 73 as a temperature signal generator, a time count unit signal generator 74, a time counting mechanism 75, a time display mechanism 76, an operating mechanism 77 and dividers 78.

The system is composed in the form of a C/MOS-IC or a composite circuit of C/MOS-IC and other electronic parts, the ratio between the temperature coefficients of the respective oscillators 71 and 73 being larger than 1.

The outputs of the oscillators 71 and 73 are subjected to frequency division in the respective dividers 78 and to the addition of frequency in the counter 72 so as to count as the minimum unit of the time count in the time count unit signal generator 74. The information in the generator 74 is displayed on the display mechanism 76 as a kept time.

The oscillator 73 acts to control the oscillation by the output of the control mechanism 79 corresponding to the signals from the time counting mechanism 75 and the time count unit signal generator 74.

The control mechanism 74 is provided for eliminating the increase of the consumed electric power by the action of the oscillator 73 and for controlling the scale of the temperature compensating operation or the timing, but it is in some cases unnecessary.

Figure 8:
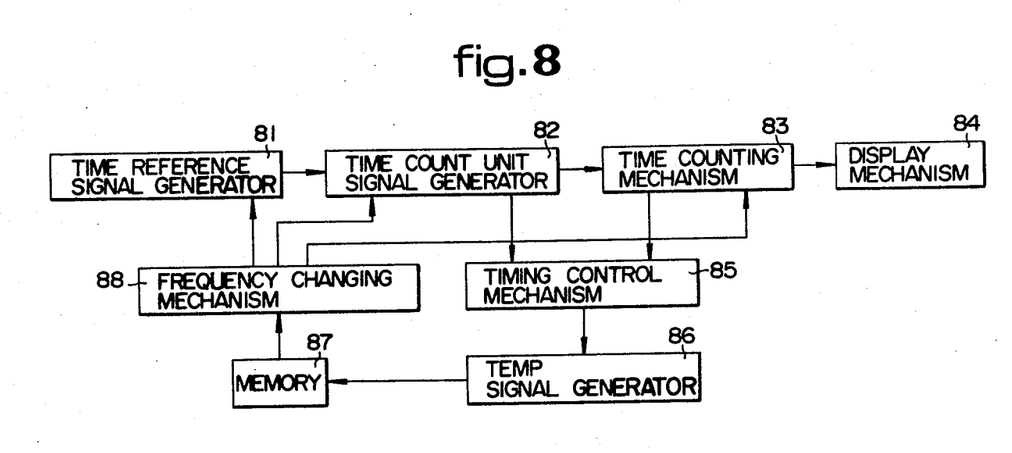
FIG. 8 is a functional block diagram of the electronic timepiece having means for compensating the temperature-frequency characteristics of the time reference signal by using the information relating to the temperature intermittently measured and to the data stored in the memory.

Referring now to FIG. 8, there is shown a system for eliminating the increase of the consumed electric power by the action of the oscillator 73 and for controlling the scale of the temperature compensating operation or the timing, the reference numeral 81 designates a time reference signal generator; 82, a time count unit signal generator; 83, a time counting mechanism; 84, a time display mechanism; 85, a timing control mechanism; 86, a temperature signal generator; 87, a memory; and 88, a frequency changing mechanism.

In the embodiment set forth above, temperature signal generator 86 comprises an oscillator which varies the resonance frequency in the wider range with temperature.

The timing control mechanism 85 is to control the start and stop operation of the temperature signal generator 86 for obtaining intermittent operation. The mechanism 85 also acts so as to eliminate increase consumption of electric power by the action of the oscillator 73 and to control the scale of the temperature compensation operation or timing. The control of the timing is done by using as an input the signals from the time count unit signal generator 82 and the time counting mechanism 83.

The temperature signal, which is obtained intermittently from the temperature signal generator 86, is supplied to the memory 87 and stored therein until the next timing. The temperature signal stored is then supplied to the frequency changing mechanism 88 and used for compensating the variation of the frequency caused by the temperature characteristics of the time reference signal frequency.

Figures 9, 12:
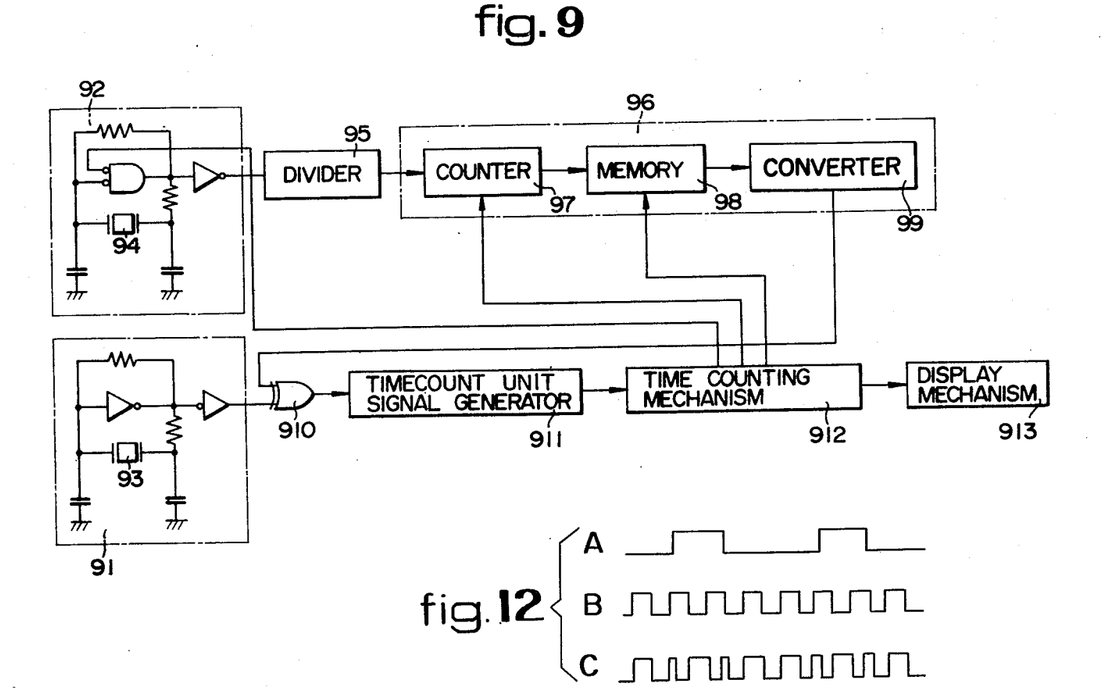
FIG. 9 is a block diagram schematically showing the structure of the electronic timepiece.

FIG. 9 illustrates a block diagram of a system using a crystal oscillator as the temperature signal generator, in which the reference numeral 91 depicts an oscillator as a time reference signal generator, and 92 an oscillator as a temperature signal generator wherein a crystal vibrator element 94 having a different temperature-frequency characteristics from that of a crystal vibrator element 93 in the oscillator 91 is used. The oscillators 91 and 92 intermittently generate outputs under the control of the time counting mechanism 912 described below.

Further to FIG. 9, the reference numeral 95 denotes a divider to divide the oscillating frequency of the oscillator, which may be omitted, and 96 temperature compensating signal generator comprising a counter 97, a memory 98 and a converter 99. The counter 97 acts to compare the output from a time counting mechanism 912 described below with the output of the divider 95 or the oscillator 92 when the divider 95 is omitted, in the manner, for example, that the counter 97 counts the output frequency from the divider 95 within the predetermined period of time in which the output from the time counting mechanism is supplied to.

The result of counting is stored in the memory 98. The stored information in the memory 98 depends on the variation of temperature, that is, the information relating to temperature. The memory 98 is controlled by the output from the time counting mechanism 912 so as to keep an information until the following information is supplied. The converter 99 generates a temperature compensating signal using the output of the memory 98 in accordance with the predetermined characteristics corresponding to the temperature-frequency characteristics of the oscillator 91. An Exclusive-OR gate denoted by the numeral 910 adds the outputs from the oscillator 91 and the converter 99, and a time count until signal generator 911 prepares a time count unit signal by dividing the output frequency of the Exclusive-OR gate. Furthermore, the reference numeral 912 designates the time counting mechanism which prepares a signal required for display of the time using the signal from the time count unit signal generator 911, and 913 is a display mechanism capable of displaying the time according to the output from the time counting mechanism 912.

When the ambient temperature varies, the resonance frequency of the oscillator 91 is a time reference signal generator which varies with the temperature, and the signal is supplied to the Exclusive-OR gate 910. On the other hand, the output frequency of the oscillator 92 as a temperature signal generator also varies with temperature, so that the output of the counter 97 is different from the time before the ambient temperature varies, and the output signal of the memory 98 will vary. Accordingly, the output of the converter 99 which is varied is supplied to the Exclusive-OR gate 910 thereby to compensate the output of the oscillator 91. Namely, the output signal having a constant frequency will be obtained even when the ambient temperature varies.

FIG. 12 shows the pulse trains which exemplify the operation of the EXCLUSIVE-OR gate 910 in the circuit of FIG. 9. The gate 910 adds the outputs from coverter 99, illustrated by pulse train A, to the output of oscillator 91, illustrated by pulse train B. The resultant pulse train C is applied to time counting mechanism 911. As is seen in FIG. 12, there is an increase in the number of pulses due to coincidence of the leading edges of the pulses A and B. The input frequency to the time count signal generator can, therefore, be kept constant in spite of temperature changes if the output signal frequency from the oscillator 91 is added in inverse proportion to the output frequency of the converter 99.

The above embodiment shown in FIG. 9, is so arranged that the variation of the frequency with temperature of the oscillator 91 is compensated for by supplying to the Exclusive-OR gate 910 the signal from the converter 99 together with the signal from the oscillator 91, but it is also possible to construct it so as to maintain the constant oscillation frequency of the oscillator 91 against variation of temperature by supplying the signal from the converter 99 to the oscillator 91.

Figure 10:
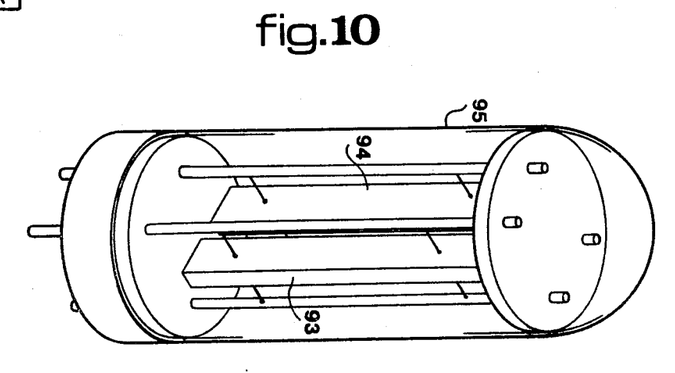
FIG. 10 is a perspective view showing two crystal vibrator elements enclosed in a common casing.

In FIG. 10 there is illustrated an assembly in which the crystal vibrator element 93 of the oscillator 91 and the crystal vibrator element 94 of the oscillator 92 are enclosed in a casing 95. In this case, the temperature compensation will be performed more stably due to the fact that both the crystal vibrator elements 93 and 94 are laid in the equal conditions. Furthermore, the assembly can be made smaller in size and has an economical advantage, because it is necessary to use a single casing.

Figure 11:
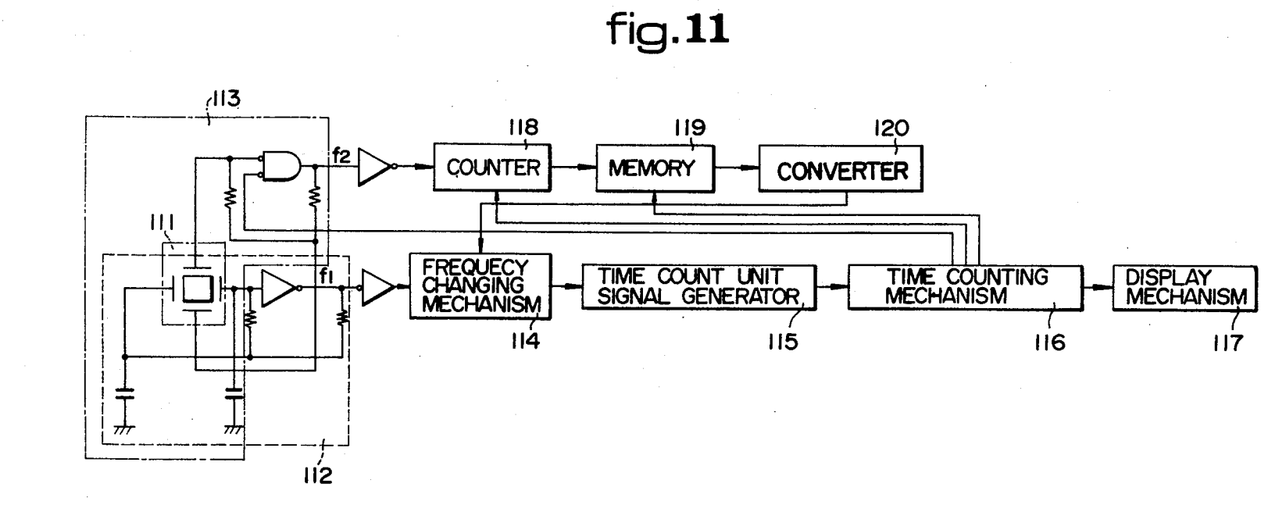
FIG. 11 is a functional block diagram of the electronic timepiece including means for compensating the variation in frequency of the time reference signal with the temperature by using two oscillation obtained from the reference oscillator which have different modes from one another.

FIG. 11 shows a further system embodying this invention in which temperature compensation is done by taking out two output signals having different vibration modes from each other which are used in the time reference signal generator and the temperature signal generator. Two kinds of modes from a reference oscillator 111 are fed to a pair of vibrator elements 112 and 113, respectively, and the oscillator 113 is controlled so as to oscillate intermittently by a time counting mechanism 116. A counter 118 is controlled, similar to oscillator 113, by the time counting mechanism 116 and reset when the output of the oscillator 113 becomes stable, and counts the input frequency within the predetermined period time. The resultant counted value which corresponds to temperature is written in a memory 116 which may store the written information until new information is supplied. The signal converter 120 generates a temperature compensating signal using the output of the memory 119 in accordance with the predetermined characteristics corresponding to the temperature-frequency characteristics of the time reference signal.

A frequency changing mechanism 114, in case of need, generates a signal used for obtaining a time count unit signal in the mechanism 115 by compensating the time reference signal from the time reference signal generator comprising the oscillator 112 in accordance with the signal from the time count unit signal generator 115 via the time counting mechanism 116. Furthermore, the time counting mechanism 116 keeps the time counted in accordance with the time count unit signal generator 115, and a display mechanism 117 displays the time. It is possible to form a system in which the function of the frequency changing mechanism 111 is given to the time count unit signal 115 or the time counting mechanism 116 itself.

The counter 118 can be constructed by connecting flip-flops in several stages if it is used in the manner of overflowing. The converter 120 may be realized with a read-only memory (so called ROM) in which codes are written for obtaining compensation of the temperature characteristics of the reference oscillator. Alternatively, a combination of gates may be used in lieu of the ROM.

According to this invention, as described above, the changes or variations of the time reference signal frequency with temperature can be compensated for stably over a long period of time and the system may be constituted as an IC without oscillators, which enables one to provide a highly accurate electronic timepiece which is small in size.

What is claimed is:
1. An electronic timepiece which is provided with a time reference signal having an output signal time count unit signal generator, a time counting mechanism and a time display mechanism; the electronic timepiece further comprising:
   a temperature signal generator for generating a temperature signal, said generator including an oscillator circuit having an output different from that of said time reference signal generator, wherein the ratio of output oscillation frequencies changes with temperature variation;
   means for transmitting said temperature signal intermittently;
   memory means for storing the temperature signal generated by said temperature generator until a subsequent temperature signal is generated and for delivering said stored temperature signal when the subsequent temperature signal is received by the memory;
   a signal converter for generating a temperature compensating signal, wherein said compensating signal compensates for the variations of the output frequency of said time reference signal generator caused by temperature variations; and
   a time reference signal frequency variable controller for synthesizing the output signal of said time reference signal generator and that of said signal converter by compensating for the changes of the output frequency of said time reference signal generator caused by the temperature variations and for delivering a resultant signal to said time unit signal generator.

2. The electronic timepiece of claim 1, wherein said temperature signal generator is timed to oscillate intermittently by the output signal of said time count unit signal generator.

3. The electronic timepiece of claim 1, wherein said temperature signal generator is timed to oscillate intermittently by the output signal from a timing control mechanism, which is driven by inputs from the time count unit signal generator and the time counting mechanism.

4. The electronic timepiece of claim 1, wherein said time reference signal generator and said temperature signal generator are crystal oscillators including crystal vibrator elements, which differ from each other in frequency output caused by the temperature variations, which results in changing frequency ratios.

5. The electronic timepiece of claim 4, wherein the vibrator elements of said crystal oscillator used as the time reference signal generator and of said crystal oscillator used as said temperature signal generator are enclosed in a common casing.

6. The electronic timepiece of claim 1, wherein frequencies of two modes of oscillation are derived from a single reference vibrator element; one of the frequencies being used as a reference vibrator element of said time reference signal generator and the other as the reference vibrator of said temperature signal generator.

7. The electronic timepiece of claim 1, wherein said temperature compensating signal generator includes EXCLUSIVE-OR gate which intermittently enables said time count unit signal generator.

* * * * *

UNITED STATES PATENT AND TRADEMARK OFFICE
CERTIFICATE OF CORRECTION

PATENT NO. : 3,978,650

DATED : September 7, 1976

INVENTOR(S) : HASHIMOTO, ET AL.

It is certified that error appears in the above-identified patent and that said Letters Patent are hereby corrected as shown below:

Insert the following Foreign Application Priority Data:

```
-- Oct. 30, 1973   Japan .............. 48/121994
   Nov. 15, 1973   Japan .............. 48/128549
   Nov. 26, 1973   Japan .............. 48/132379 --
```

Signed and Sealed this

Second Day of November 1976

[SEAL]

Attest:

RUTH C. MASON
*Attesting Officer*

C. MARSHALL DANN
*Commissioner of Patents and Trademarks*